United States Patent
Guan et al.

(10) Patent No.: US 12,073,102 B2
(45) Date of Patent: Aug. 27, 2024

(54) METHOD AND APPARATUS FOR COMPRESSING DATA OF STORAGE SYSTEM, DEVICE, AND READABLE STORAGE MEDIUM

(71) Applicant: HUAWEI TECHNOLOGIES CO., LTD., Guangdong (CN)

(72) Inventors: Kun Guan, Saint Petersburg (RU); Shaohui Quan, Hangzhou (CN); Liyu Wang, Xi'an (CN); Jianqiang Shen, Hangzhou (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 18/340,853

(22) Filed: Jun. 24, 2023

(65) Prior Publication Data

US 2023/0333764 A1    Oct. 19, 2023

Related U.S. Application Data

(63) Continuation of application No. 17/579,904, filed on Jan. 20, 2022, which is a continuation of application No. PCT/CN2019/097144, filed on Jul. 22, 2019.

(51) Int. Cl.
  *G06F 3/06* (2006.01)
  *H03M 7/30* (2006.01)

(52) U.S. Cl.
  CPC .......... *G06F 3/0641* (2013.01); *G06F 3/0608* (2013.01); *G06F 3/0673* (2013.01);
  (Continued)

(58) Field of Classification Search
  CPC .... G06F 3/0641; G06F 3/0608; G06F 3/0673; H03M 7/30; H03M 7/3091
  See application file for complete search history.

(56) References Cited

U.S. PATENT DOCUMENTS 6,348,881 B1 *  2/2002  Buer ............... H03M 7/3084
                                                  375/240
7,079,051 B2 *  7/2006  Storer ................. H03M 7/30
                                                    341/51
(Continued)

FOREIGN PATENT DOCUMENTS

CN    102246137 A  * 11/2011  .......... G06F 11/1453
CN    105743509 A    7/2016
(Continued)

OTHER PUBLICATIONS

D. Geer, "Reducing the Storage Burden via Data Deduplication," in Computer, vol. 41, No. 12, pp. 15-17, Dec. 2008, doi: 10.1109/MC.2008.538. (Year: 2008).*

*Primary Examiner* — Christopher D Birkhimer
(74) *Attorney, Agent, or Firm* — HUAWEI TECHNOLOGIES CO., LTD.

(57) ABSTRACT

In a method for compressing data, a storage system determines whether deduplication can be performed on a target data block. When deduplication cannot be performed on the target data block, the storage system obtaining a similar fingerprint of the target data block, and determines, based on the similar fingerprint, a combined data block group to which the target data block belongs. The storage system then performs similar compression on the target data block based on a reference block in the combined data block group.

11 Claims, 4 Drawing Sheets

(52) U.S. Cl.
CPC ............ *H03M 7/30* (2013.01); *G06F 3/0674* (2013.01); *G06F 3/0676* (2013.01)

(56) References Cited

U.S. PATENT DOCUMENTS

| | | | | |
|---|---|---|---|---|
| 7,610,437 B2* | 10/2009 | Sinclair | ................. | G06F 3/0652 711/104 |
| 7,984,084 B2* | 7/2011 | Sinclair | ............... | G06F 16/1847 707/818 |
| 8,285,918 B2* | 10/2012 | Maheshwari | ........ | G11C 7/1072 711/159 |
| 8,443,263 B2* | 5/2013 | Selinger | .............. | G06F 11/1068 714/768 |
| 8,732,403 B1* | 5/2014 | Nayak | .................. | G06F 3/0619 711/170 |
| 8,873,284 B2* | 10/2014 | Sinclair | ............... | G06F 12/0246 365/185.11 |
| 9,223,693 B2* | 12/2015 | Sinclair | ............... | G06F 12/0246 |
| 9,336,133 B2* | 5/2016 | Sinclair | ............... | G06F 12/0246 |
| 9,348,746 B2* | 5/2016 | Sinclair | ............... | G06F 12/0246 |
| 9,465,731 B2* | 10/2016 | Sinclair | ............... | G06F 12/0246 |
| 9,514,146 B1* | 12/2016 | Wallace | ............ | G06F 16/24561 |
| 9,715,434 B1* | 7/2017 | Xu | .......................... | G06F 3/067 |
| 9,734,050 B2* | 8/2017 | Sinclair | ............... | G06F 12/0253 |
| 9,734,911 B2* | 8/2017 | Sinclair | ................ | G06F 3/0658 |
| 9,778,855 B2* | 10/2017 | Sinclair | .................... | G06F 3/064 |
| 10,108,543 B1* | 10/2018 | Duggal | .................... | G06F 11/14 |
| 10,108,544 B1* | 10/2018 | Duggal | .................... | G06F 11/14 |
| 10,120,613 B2* | 11/2018 | Sinclair | .................... | G06F 12/02 |
| 10,133,490 B2* | 11/2018 | Sinclair | .................. | G06F 3/0655 |
| 10,255,179 B2* | 4/2019 | Ji | ......................... | G06F 3/0659 |
| 10,430,279 B1* | 10/2019 | Dittia | .................... | G06F 3/0656 |
| 10,664,165 B1* | 5/2020 | Faibish | .................. | G06F 3/0638 |
| 10,739,996 B1* | 8/2020 | Ebsen | ................... | G06F 16/1727 |
| 10,795,812 B1* | 10/2020 | Duggal | ................... | G06F 3/067 |
| 10,983,715 B2* | 4/2021 | Sharoni | ................... | G06F 21/79 |
| 11,086,537 B2* | 8/2021 | Byun | ..................... | G06F 3/0604 |
| 2007/0033325 A1* | 2/2007 | Sinclair | ................. | G06F 3/0608 711/170 |
| 2008/0082596 A1* | 4/2008 | Gorobets | ............ | G06F 12/0253 |
| 2008/0133561 A1* | 6/2008 | Dubnicki | ................ | G06F 16/113 |
| 2008/0144079 A1* | 6/2008 | Pandey | .................... | H03M 7/30 358/1.15 |
| 2008/0189477 A1* | 8/2008 | Asano | ................. | G06F 12/0246 711/E12.008 |
| 2010/0077013 A1* | 3/2010 | Clements | ............ | G06F 16/1748 707/822 |
| 2010/0088296 A1* | 4/2010 | Periyagaram | ........ | G06F 16/183 707/E17.014 |
| 2010/0125553 A1* | 5/2010 | Huang | ................ | G06F 11/1453 707/661 |
| 2010/0174881 A1* | 7/2010 | Anglin | ................ | G06F 11/1453 711/E12.103 |
| 2010/0281081 A1* | 11/2010 | Stager | ................... | G06F 9/5022 707/814 |
| 2010/0333116 A1* | 12/2010 | Prahlad | ................... | G06F 3/061 713/153 |
| 2011/0145473 A1* | 6/2011 | Maheshwari | ........ | G11C 7/1072 711/E12.008 |
| 2011/0161784 A1* | 6/2011 | Selinger | .............. | G06F 11/1016 714/E11.002 |
| 2013/0166861 A1* | 6/2013 | Takano | .................... | G06F 3/064 711/161 |
| 2014/0114932 A1* | 4/2014 | Mallaiah | ............... | G06F 3/0641 707/E17.032 |
| 2014/0143517 A1* | 5/2014 | Jin | ........................ | G06F 12/023 711/171 |
| 2014/0325148 A1* | 10/2014 | Choi | ..................... | G06F 3/0659 711/114 |
| 2014/0365719 A1* | 12/2014 | Kuzmin | .............. | G06F 12/0246 711/103 |
| 2015/0010143 A1 | 1/2015 | Yang | | |
| 2015/0205816 A1* | 7/2015 | Periyagaram | ....... | G06F 11/1453 707/827 |
| 2015/0227602 A1* | 8/2015 | Ramu | ................. | G06F 11/1456 707/634 |
| 2015/0261776 A1* | 9/2015 | Attarde | ............... | G06F 16/1748 707/664 |
| 2016/0246713 A1* | 8/2016 | Choi | .................... | G06F 3/0608 |
| 2016/0350324 A1* | 12/2016 | Wang | .................. | G06F 16/137 |
| 2017/0038978 A1* | 2/2017 | Li | ........................ | G06F 3/0611 |
| 2017/0123655 A1* | 5/2017 | Sinclair | .................... | G06F 3/061 |
| 2017/0242790 A1* | 8/2017 | O'Krafka | ............ | G06F 3/0652 |
| 2017/0293450 A1* | 10/2017 | Battaje | .................. | G06F 3/0679 |
| 2018/0025046 A1* | 1/2018 | Singhai | ................ | G06F 3/0641 707/692 |
| 2018/0095674 A1* | 4/2018 | Alameldeen | ............ | G06F 3/064 |
| 2018/0189175 A1* | 7/2018 | Ji | .......................... | G06F 3/0679 |
| 2018/0314727 A1* | 11/2018 | Epstein | .................... | G06N 5/01 |
| 2018/0349053 A1* | 12/2018 | Battaje | .................. | G06F 12/0891 |
| 2019/0026042 A1* | 1/2019 | Gupta | .................. | G06F 16/215 |
| 2020/0089420 A1* | 3/2020 | Sharoni | ................... | G06F 21/79 |
| 2020/0192794 A1* | 6/2020 | Lee | ....................... | G06F 12/0246 |
| 2020/0218653 A1* | 7/2020 | Ryu | ....................... | G06F 12/0253 |
| 2020/0310686 A1* | 10/2020 | Truong | ................... | G06F 3/061 |
| 2021/0036714 A1* | 2/2021 | Martin | ................ | H03M 7/6064 |
| 2021/0342362 A1* | 11/2021 | Haravu | ................. | G06F 11/1464 |
| 2021/0374021 A1* | 12/2021 | Santhakumar | ........ | G06F 3/0659 |

FOREIGN PATENT DOCUMENTS

| | | | | |
|---|---|---|---|---|
| CN | 109716658 A | | 5/2019 | |
| EP | 2571171 A2 | | 3/2013 | |
| KR | 20170054299 A | * | 5/2017 | |
| WO | WO-2012029258 A1 | * | 3/2012 | ......... G06F 12/0253 |

* cited by examiner

METHOD AND APPARATUS FOR COMPRESSING DATA OF STORAGE SYSTEM, DEVICE, AND READABLE STORAGE MEDIUM

CROSS-REFERENCE TO RELATED APPLICATIONS

This is a continuation of U.S. application Ser. No. 17/579,904, filed on Jan. 20, 2022, which is a continuation of International Patent Application No. PCT/CN2019/097144, filed on Jul. 22, 2019. The aforementioned priority applications are hereby incorporated by reference in their entirety.

TECHNICAL FIELD

This application relates to the field of storage technologies, and in particular, to a method and an apparatus for compressing data of a storage system, a device, and a readable storage medium.

BACKGROUND

With rapid development of big data, cloud computing, and artificial intelligence, enterprises have an explosive growth in data storage requirements. If data is directly stored, relatively large storage space is occupied, and costs are relatively high. To improve utilization of storage space, a data reduction technology is usually used to compress data.

In a related technology, a deduplication technology is generally used to improve the utilization of storage space. To be specific, a file is divided into data blocks of a same size, and a deduplication fingerprint of each data block is calculated. Because a same deduplication fingerprint indicates that content of data blocks is the same, data blocks with a same deduplication fingerprint can be stored only once.

When the deduplication technology is used, redundant data can be deleted only when content of data blocks is the same. During actual data storage, however, there is a low probability that there are data blocks that are completely the same. Therefore, a data reduction effect is poor.

SUMMARY

Embodiments of this application provide a method and an apparatus for compressing data of a storage system, a device, and a readable storage medium, to overcome a problem of a poor data reduction effect in a related technology.

According to an aspect, this application provides a method for compressing data of a storage system. The method includes:
determining whether deduplication can be performed on a target data block; when deduplication cannot be performed on the target data block, obtaining a similar fingerprint of the target data block; determining, based on the similar fingerprint, a combined data block group to which the target data block belongs; and performing similar compression on the target data block based on a reference block in the combined data block group.

In a solution shown in this embodiment of this application, when the storage system stores data blocks in batches, the storage system determines whether deduplication can be performed on a target data block that refers to any one of the data blocks. When the storage system determines that deduplication cannot be performed on the target data block, the storage system may obtain the similar fingerprint of the target data block. The storage system may determine the similar fingerprint of the target data block before determining whether deduplication can be performed on the target data block, or when determining that deduplication cannot be performed on the target data block. A determining manner may be: splitting the target data block into equal-sized data units, and separately inputting each data unit into a preset hash function, to obtain an output result, namely, the similar fingerprint of the target data block. It can be learned that the similar fingerprint of the target data block is not one numeric value, but includes a group of numeric values.

After obtaining the similar fingerprint of the target data block, the storage system may determine the combined data block group to which the target data block belongs. Data blocks included in the combined data block group may be compressed together. The storage system may further determine the reference block in the combined data block group. If the target data block is not the reference block in the combined data block group, the storage system may determine differential data between the target data block and the reference block, and compress the differential data. If the target data block is the reference block in the combined data block group, the storage system may compress the target data in a conventional compression manner, and perform similar compression on the other data blocks in the combined data block group in a same manner as the target data block. In this way, similar compression and deduplication are combined. When deduplication cannot be performed, similar compression can be used to further compress some data, to improve a reduction rate.

In a possible implementation, the determining whether deduplication can be performed on a target data block includes: generating a deduplication fingerprint of the target data block; and querying whether the storage system has a fingerprint the same as the deduplication fingerprint, to determine whether deduplication can be performed on the target data block.

In the solution shown in this embodiment of this application, a deduplication fingerprint table is recorded in the storage system. The deduplication fingerprint table includes a deduplication fingerprint of a data block that is compressed and stored, a deduplication fingerprint of a received data block that is not compressed, and metadata information of the corresponding data block. The storage system may input the target data block into a fingerprint extraction function, to obtain the deduplication fingerprint of the target data block as an output result. The fingerprint extraction function may be a hash function. Then, the storage system determines, in the deduplication fingerprint table by using the deduplication fingerprint, whether the deduplication fingerprint exists in the received data block that is not compressed. If the deduplication fingerprint exists in the received data block that is not compressed, it may indicate that a same data block exists. In this case, deduplication can be performed on the target data block. If the deduplication fingerprint does not exist in the received data block that is not compressed, it may indicate that the target data block does not exist. In this case, deduplication cannot be performed on the target data block, the target data block needs to be directly compressed in a conventional manner (for example, Huffman encoding), and a compressed data block is stored. In this way, whether deduplication can be performed on the target data block can be accurately determined.

In a possible implementation, the determining whether deduplication can be performed on a target data block includes: determining a load of the storage system to determine whether deduplication can be performed on the target data block.

In the solution shown in this embodiment of this application, the load of the storage system directly affects storage efficiency of a data block. The storage system may determine the load of the storage system, and determine whether the load meets a load exceeding condition. The load may be reflected by a central processing unit (CPU) usage, a storage space usage, and a current time period. If the load meets the load exceeding condition, the storage system performs deduplication to improve processing efficiency of the storage system. If the load does not meet the load exceeding condition, the storage system has high processing efficiency and does not perform deduplication. In this way, the processing efficiency of the storage system can be improved by determining the load.

In a possible implementation, the method further includes: consecutively storing, in a same storage block, compressed data obtained after similar compression is performed on the target data block, and compressed data of another data block in the combined data block group.

In the solution shown in this embodiment of this application, when compressed data obtained after similar compression is performed on the target data block is stored, a storage block in which the compressed data of the other data block in the combined data block group is stored and a storage location of the compressed data in the storage block may be determined. Then, the compressed data obtained after similar compression is performed on the target data block and the compressed data of the other data block in the combined data block group are consecutively stored together. In this way, during data reading, differential data and data of the reference block can be read at a time. This can improve data reading efficiency.

In a possible implementation, if there are a plurality of data blocks other than the reference block in the combined data block group, compressed data of m data blocks is before the data of the reference block, and compressed data of n data blocks is after the reference block, where a difference between m and n is equal to any one of 0, 1, or −1, and both m and n are greater than or equal to 1.

In the solution shown in this embodiment of this application, if there are a plurality of data blocks other than the reference block in the combined data block group, assuming that there are m+n data blocks other than the reference block, the compressed data of m data blocks may be set before the data of the reference block, and the compressed data of n data blocks may be set after the data of the reference block. If m+n is an odd number, a relationship between m and n may be that m−n is equal to 1 or −1. If m+n is an even number, a relationship between m and n may be that m−n is equal to 0. In this way, during data reading, if differential data of a data block after the reference block needs to be read, the reading may directly start from the reference block until the differential data of the data block is read, without a need to read differential data of all data blocks. If differential data of a data block before the reference block needs to be read, the reading may directly start from the differential data of the data block, and ends after the data of the reference block is read, without a need to read all the data. Therefore, less data is read, and reading efficiency is improved.

In a possible implementation, the determining, based on the similar fingerprint, a combined data block group to which the target data block belongs includes: determining, based on a similar fingerprint quantity, a data block group corresponding to the target data block, where the similar fingerprint quantity is a quantity of same similar fingerprints in any two data blocks in one data block group; and forming, in the data block group corresponding to the target data block, a first quantity of data blocks that have a same target fingerprint as the target data block into the combined data block group to which the target data block belongs, where a data amount of differential data between the target data block and a data block that has the target fingerprint is less than a data amount of differential data between the target data block and a data block that does not have the target fingerprint.

In the solution shown in this embodiment of this application, a similar fingerprint table is established in the storage system. The similar fingerprint table includes a correspondence between each similar fingerprint and metadata information of a data block. The storage system may determine, based on the similar fingerprint table, an uncompressed data block corresponding to each fingerprint in the similar fingerprint of the target data block. Then, data blocks having a similar fingerprint quantity of same fingerprints are grouped into one group by using the similar fingerprint quantity. In this way, the data block group corresponding to the target data block can be obtained. In the data block group corresponding to the target data block, data blocks that have a same target fingerprint as the target data block and that do not form a combined data block group with another data block may be successively selected from each data block group, to form the combined data block group to which the target data block belongs. A combined data block group to which any data block belongs may be determined in this manner. Because the data amount of the differential data between the target data block and the data block that has the target fingerprint is less than the data amount of the differential data between the target data block and the data block that does not have the target fingerprint, the data block that has the target fingerprint and the target data block are selected to form a combined data block group, and are compressed together. This can improve the reduction rate.

In a possible implementation, the determining, based on the similar fingerprint, a combined data block group to which the target data block belongs includes: determining, based on a similar fingerprint quantity, a data block group corresponding to the target data block, where the similar fingerprint quantity is a quantity of same similar fingerprints in any two data blocks in one data block group; determining a quantity of same similar fingerprints in the target data block and in a data block in each data block group; and forming, in the data block group corresponding to the target data block, a first quantity of data blocks that have a maximum quantity of same similar fingerprints as the target data block into the combined data block group to which the target data block belongs.

In the solution shown in this embodiment of this application, a similar fingerprint table is established in the storage system. The similar fingerprint table includes a correspondence between each similar fingerprint and metadata information of a data block. The storage system may determine, based on the similar fingerprint table, an uncompressed data block corresponding to each fingerprint in the similar fingerprint of the target data block. Then, data blocks having a similar fingerprint quantity of same fingerprints are grouped into one group by using the similar fingerprint quantity. In this way, the data block group corresponding to the target data block can be obtained. For the target data block, in the data block group corresponding to the target data block, data blocks that do not form a combined data block group with another data block are determined, a quantity of same similar fingerprints in the data blocks and in the target data block is determined, and then the data blocks are arranged in descending order. The first quantity of the data blocks are consecutively selected from the beginning in sequence, to form the combined data block group to which the target data block belongs. In this way, if data blocks have more same similar fingerprints, it indicates that data blocks are more similar. Data blocks having a relatively large quantity of same similar fingerprints may be selected to form the combined data block group, so that a data reduction rate can be improved.

According to an aspect, an apparatus for compressing data of a storage system is provided. The apparatus includes one or more modules, configured to perform the foregoing method for compressing data of a storage system.

According to an aspect, a storage device is provided. The storage device includes an interface and a processor. The interface and the processor cooperate to perform the foregoing method for compressing data of a storage system.

According to an aspect, a computer-readable storage medium is provided. The computer-readable storage medium stores an instruction, and when the computer-readable storage medium runs on a storage system, the storage system is enabled to perform the foregoing method for compressing data of a storage system.

According to an aspect, a computer program product includes an instruction is provided. When the computer program product runs on a storage system, the storage system is enabled to perform the foregoing method for compressing data of a storage system.

The technical solutions provided in this application include at least the following beneficial effects:

In the embodiments of this application, when a data block is stored, whether deduplication can be performed on a target data block is determined; when deduplication cannot be performed on the target data block, a similar fingerprint of the target data block is obtained; a combined data block group to which the target data block belongs is determined based on the similar fingerprint; and similar compression is performed on the target data block based on a reference block in the combined data block group. In this way, similar compression and deduplication are combined. When deduplication cannot be performed, similar compression can be used to further compress some data, to improve a reduction rate.

DESCRIPTION OF EMBODIMENTS

To make the objectives, technical solutions, and advantages of this application clearer, the following further describes the implementations of this application in detail with reference to the accompanying drawings.

To facilitate understanding of the embodiments of this application, the following first describes a system architecture and concepts of nouns in the embodiments of this application.

Figure 1:
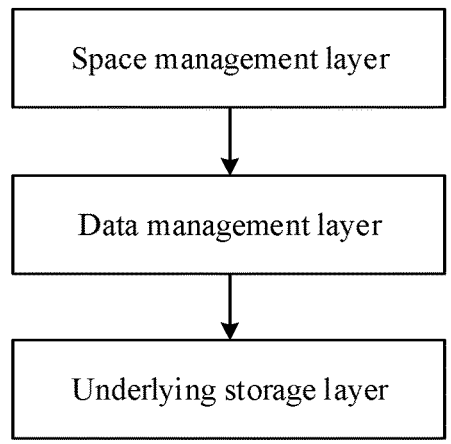
FIG. 1 is an architectural diagram of a storage system according to an example embodiment of this application.

The embodiments of this application are applicable to a storage system in the storage field. The storage system may be a server with a storage function, a server cluster with a storage function, a storage array, a distributed storage system, or the like. An architecture of the storage system may be shown in FIG. 1. The storage system may include a space management layer, a data management layer, and an underlying storage layer. The space management layer may include a plurality of execution modules. The underlying storage layer may also include a plurality of execution modules. The space management layer may be configured to connect to an upper layer, receive data, and send the data to the data management layer. The data management layer may be configured to compress an input data block to obtain a compressed data block, and send the compressed data block to the underlying storage layer for storage. For example, an input of the data management layer is data blocks A1, B, A2, . . . , X, and B, and an output of the data management layer is data blocks A1, A2, B, . . . , and X. Because only one B is stored, the amount of stored data is reduced.

Compression: A compression technology can be classified into lossless compression and lossy compression. Lossless compression means that compressed data is decompressed, and obtained data the same data as original data. The storage system mainly uses compression algorithms, such as Huffman encoding, lempel ziv zelch (lzw), and deflaft. Lossy compression means that compressed data is decompressed, and obtained data is different from original data. Lossy compression is mainly applicable to the field of image or video compression.

Deduplication: Same files or data blocks in a distributed storage system are eliminated, to effectively reduce physical storage space occupied by data. This technology can be used in storage backup and archiving systems. Generally, a file is divided into a plurality of data blocks, a deduplication fingerprint of each data block is calculated, and data with same fingerprints indicates that data blocks have same content. Therefore, original data can be stored only once for data blocks with same fingerprints, to reduce a data amount.

An embodiment of this application provides a method for compressing data of a storage system. The method may be performed by the storage system.

Figure 2:
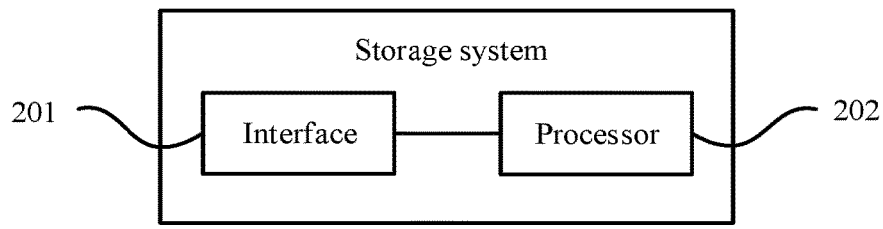
FIG. 2 is a structural diagram of a storage system according to an example embodiment of this application.

FIG. 2 is a block diagram of a structure of a storage system according to an embodiment of this application. The storage system may include at least an interface 201 and a processor 202. The interface 201 may be configured to receive data. In a specific implementation, the interface 201 may be a hardware interface, for example, a network interface card (network interface card, NIC) or a host bus adapter (host bus adapter, HBA), or may be a program interface module. The processor 202 may be a combination of a central processing unit and a memory, or may be a field programmable gate array (field programmable gate array, FPGA) or other hardware. The processor 202 may alternatively be a combination of a central processing unit and other hardware, for example, a combination of the central processing unit and an FPGA. The processor 202 may be a control center of the storage system, and is connected to all parts of the entire storage system through various interfaces and lines. In a possible implementation, the processor 202 may include one or more processing cores. Further, the storage system further includes a hard disk, configured to provide storage space for the storage system.

Figure 3:
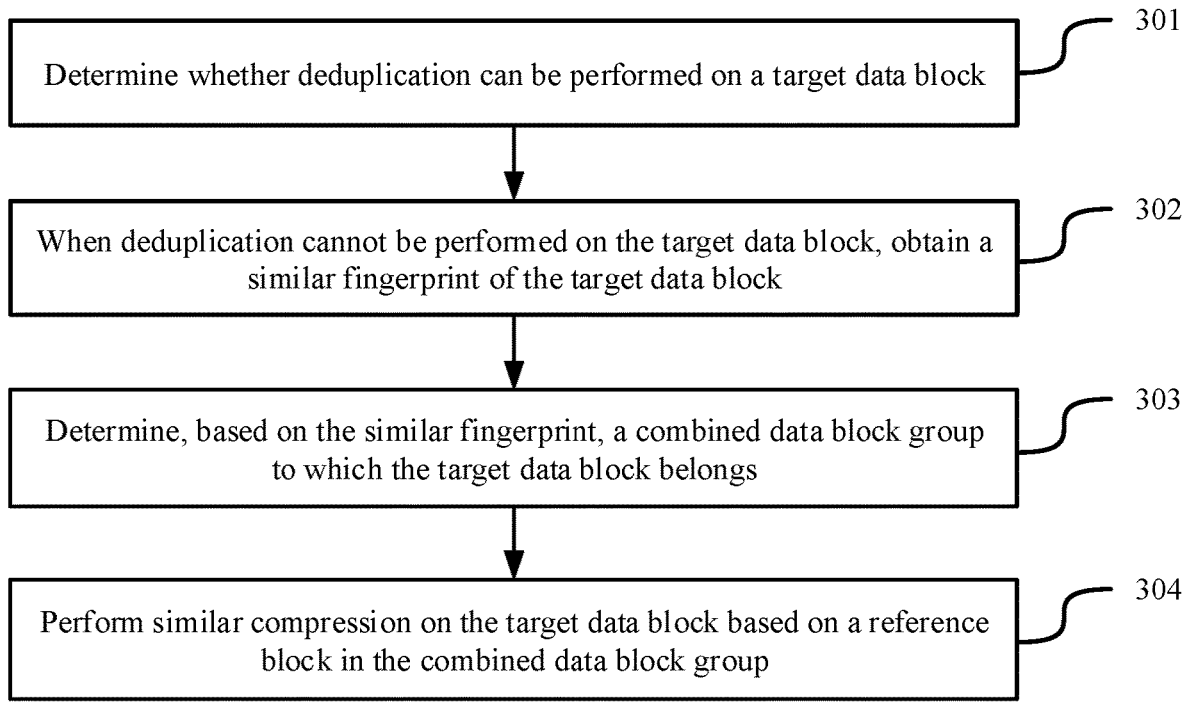
FIG. 3 is a flowchart of a method for compressing data of a storage system according to an example embodiment of this application.

An embodiment of this application provides a method for compressing data of a storage system. As shown in FIG. 3, an execution procedure of the method may include the following steps.

Step 301: Determine whether deduplication can be performed on a target data block.

During implementation, after the storage system is online, if an upper-layer application needs to store data, the upper-layer application may send the data to the storage system. The storage system receives the data. If a data amount of the data is relatively large, the storage system may divide the data into data blocks, and a size of each data block may be 4 KB, 8 KB, or another value. If the data amount of the data is less than a data amount of one data block, the data may be directly determined as a data block. Then, the storage system may periodically process the data blocks, or process the data blocks in batches when a data amount of received data blocks reaches a specific value. Any data block in the data blocks processed in batches this time may be the target data block, and whether deduplication can be performed on the target data block may be determined based on a current status of the storage system, whether the storage system stores a deduplication fingerprint of the target data block, or the like.

In the step 301, there are a plurality of manners of determining whether deduplication can be performed on the target data block. The following provides two feasible implementations.

Manner 1: Generate the deduplication fingerprint of the data block, and query whether the storage system has a fingerprint that is the same as the deduplication fingerprint, to determine whether deduplication can be performed on the data block.

During implementation, a deduplication fingerprint table is recorded in the storage system. The deduplication fingerprint table includes a deduplication fingerprint of a data block that is compressed and stored, a deduplication fingerprint of a received data block that is not compressed, and metadata information of the corresponding data block. Each time after the storage system determines the deduplication fingerprint of the data block, the storage system correspondingly adds the deduplication fingerprint and corresponding metadata information to the deduplication fingerprint table. The metadata information of the data block includes an identifier indicating whether the data block is a reference block or a duplicate block (if the data block is determined, a location where the data block is not determined may not be filled, and is subsequently filled after the data block is determined), a storage location (if the data block is stored, the data block has a storage location), and the like.

The storage system may input the target data block into a fingerprint extraction function, to obtain the deduplication fingerprint of the target data block as an output result. The fingerprint extraction function may be a hash function. Then, the storage system determines, in the deduplication fingerprint table by using the deduplication fingerprint, whether the deduplication fingerprint exists in the received data block that is not compressed. If the deduplication fingerprint exists in the received data block that is not compressed, it may indicate that a same data block exists. In this case, deduplication can be performed on the target data block. If the deduplication fingerprint does not exist in the received data block that is not compressed, it may indicate that the target data block does not exist. In this case, deduplication cannot be performed on the target data block.

Manner 2: Determine a load of the storage system to determine whether deduplication can be performed on the data block.

During implementation, the storage system may determine the load of the storage system, and determine whether a current CPU usage exceeds a first value. The load may be reflected by a CPU usage, a storage space usage, and a current time period. If the current CPU usage exceeds the first value, the storage system may determine that the load meets a load exceeding condition, and perform deduplication. The storage system may determine whether a current storage space usage exceeds a second value. If the current storage space usage exceeds the second value, the storage system may determine that the load meets the load exceeding condition, and perform deduplication. The storage system may determine a current time point, to determine a time period in which the current time point is located. If the time period in which the current time point is located is a target time period, and the target time period may be from 7:00 to 24:00, the load meets the load exceeding condition. The storage system may perform any one or more of the foregoing operations to determine that the load meets the load exceeding condition. If none of the foregoing conditions is met, the load does not meet the load exceeding condition. The storage system may concurrently determine whether the current CPU usage exceeds the first value, whether the current storage space usage exceeds the second value, and the current time period. As long as one determining result is that the load meets the load exceeding condition, the storage system may stop remaining determining operations.

If the storage system determines that the load of the storage system meets the load exceeding condition, the storage system may perform deduplication on the data block. If the storage system determines that the load of the storage system does not meet the load exceeding condition, the storage system may determine that deduplication does not need to be performed.

It should be noted that, because a CPU needs to be occupied each time a data block is compressed, the CPU needs to be considered. Because storage space is also occupied when duplicate data is stored, the storage space also needs to be considered. In some time periods, the upper-layer application stores a large amount of data, and in another time period, upper-layer application stores a small amount of data. Therefore, deduplication needs to be performed during peak hours and does not need to be performed during off-peak hours.

Step 302: When deduplication cannot be performed on the target data block, obtain a similar fingerprint of the target data block.

The similar fingerprint may include one or more fingerprints.

During implementation, when deduplication cannot be performed on the target data block, the storage system may obtain the similar fingerprint of the target data block. The similar fingerprint of the target data block may be added to a similar fingerprint table. The storage system stores the similar fingerprint table. The similar fingerprint table includes a correspondence between each similar fingerprint and metadata information of a data block. Similar fingerprints included in the similar fingerprint table are similar fingerprints of data blocks whose the similar fingerprints are determined (including a similar fingerprint of uncompressed data and a similar fingerprint of a compressed data block). For any data block, the metadata information in the similar fingerprint table includes information such as an identifier indicating whether the data block is a reference block or a similar block (if the data block is determined, a location where the data block is not determined may not be filled, and is subsequently filled after the data block is determined), and a storage location (if the data block is stored, the data block has a storage location). In addition, the metadata information may further record a strongly similar fingerprint, for example, a target fingerprint identifier mentioned below. A strongly similar fingerprint of a data block is determined based on all similar fingerprints of the data block, and may be obtained by performing processing, for example, weighting (for example, there are three similar fingerprints: a fingerprint 1, a fingerprint 2, and a fingerprint 3, each fingerprint corresponds to a weight value, and the weight values respectively are a, b, and c. A sum of a, b, and c is equal to 1, and the strongly similar fingerprint is equal to a*fingerprint 1+b*fingerprint 2+c*fingerprint 3). This may reflect all fingerprints in the similar fingerprint. The similar fingerprint table may be stored in a form of a table. As shown in Table 1, similar fingerprints include a fingerprint 1, a fingerprint 2, . . . , and a fingerprint n. The fingerprint 1 corresponds to metadata information of a data block 1, metadata information of a data block 2, metadata information of a data block 3, and the like. The fingerprint 2 corresponds to the metadata information of the data block 2, the metadata information of the data block 3, metadata information of a data block 5, and the like. The fingerprint n corresponds to the metadata information of the data block 1, metadata information of a data block 4, and the like.

TABLE 1

| Fingerprint | Metadata information |
| --- | --- |
| Fingerprint 1 | The metadata information of the data block 1, the metadata information of the data block 2, and the metadata information of the data block 3 |
| Fingerprint 2 | The metadata information of the data block 2, the metadata information of the data block 3, and the metadata information of the data block 5 |
| . . . | . . . |
| Fingerprint n | The metadata information of the data block 1, and the metadata information of the data block 4 |

It should be noted that, in this embodiment of this application, the similar fingerprint of the target data block may be determined when it is determined that deduplication cannot be performed on the target data block, or the similar fingerprint of the target data block may be determined when whether deduplication can be performed is determined. When a similar fingerprint is determined, a hash algorithm may be used to determine the similar fingerprint of the target data block. The processing may be: dividing the target data block into a plurality of small data units (each data unit has a same length), and calculating a hash value, namely the similar fingerprint of the target data block, for each data unit by using a preset hash function.

It should be noted that, when the storage system is just online, the similar fingerprint table is blank. As time goes by, more data blocks are stored, and the similar fingerprint table is increasingly large.

It should be further noted that the foregoing hash functions for determining the deduplication fingerprint and the similar fingerprint are different functions.

In addition, when deduplication cannot be performed on the target data block, the similar fingerprint of the target data block is directly determined. Alternatively, when deduplication cannot be performed on the target data block, the similar fingerprint of the target data block may not be directly determined, instead, whether the load of the storage system meets the load exceeding condition is determined (for determining processing, refer to the foregoing implementation 2). If the load exceeding condition is met, the similar fingerprint of the target data block may be generated. If the load exceeding condition is not met, subsequent similar compression processing may not be performed, in other words, the similar fingerprint of the target data block is not determined, and subsequent steps 303 and 304 may not be performed.

Step 303: Determine, based on the similar fingerprint, a combined data block group to which the target data block belongs.

During implementation, the storage system may determine, in the similar fingerprint table by using the similar fingerprints of the target data block, a data block group corresponding to each fingerprint in the similar fingerprint of the target data block, and then determine, in the data block groups, the combined data block group to which the target data block belongs.

In an optional implementation, the combined data block group to which the target data block belongs may be determined in a plurality of manners. The following provides two feasible manners.

Manner 1: Determine, based on a similar fingerprint quantity, a data block group corresponding to the target data block, where the similar fingerprint quantity is a quantity of same similar fingerprints in any two data blocks in one data block group; and form, in the data block group corresponding to the target data block, a first quantity of data blocks that have a same target fingerprint as the target data block into the combined data block group to which the target data block belongs.

The similar fingerprint quantity may be set in advance, and is stored in the storage system. For example, the similar fingerprint quantity may be 2. The similar fingerprint quantity is related to a quantity of similar fingerprints extracted from each data block. Generally, a larger quantity of fingerprints included in a similar fingerprint indicates a larger similar fingerprint quantity, and a smaller quantity of fingerprints included in a similar fingerprint indicates a smaller similar fingerprint quantity. A data amount of differential data between data blocks having the target fingerprint (which may also be referred to as a strongly similar fingerprint) is the smallest, so that a data amount of compressed data of the data blocks is the smallest. The first quantity may be preset, for example, 8.

During implementation, the foregoing similar fingerprint table is established in the storage system, and an uncompressed data block corresponding to each fingerprint in the similar fingerprint of the target data block may be determined from the similar fingerprint table. Then, data blocks having a similar fingerprint quantity of same fingerprints are grouped into one group by using the similar fingerprint quantity, to determine a data block group where the target data block is located, namely the data block group corresponding to the target data block.

When the target data block has not been selected as a member of another reference block, in the data block group corresponding to the target data block, data blocks that have a same target fingerprint as the target data block and that do not form a combined data block group with another data block may be successively selected from each data block group, to form the combined data block group to which the target data block belongs. For any data block, a combined data block group to which each data block belongs may be determined in this manner.

For the target data block, when a member is selected for the other reference block, if a target fingerprint exists in both a reference block and the target data block, a combined data block group to which the reference block belongs may be determined as the combined data block group to which the target data block belongs.

It should be noted that, if a quantity of data blocks in a data block group is limited, after the quantity of data blocks in the combined data block group reaches the first quantity, no data block is further added to the combined data block group. For example, the target data block corresponds to three data block groups. When a quantity of data blocks that are in the first two data block groups and that have the target fingerprint of the target data block has reached the first quantity, the data blocks form a combined data block group. In this case, the combined data block group to which the target data block belongs is determined.

For example, similar fingerprints of a target data block C3 include a fingerprint 1, a fingerprint 2, and a fingerprint 3, a target fingerprint of C3 is a fingerprint 4, and the similar fingerprint quantity is 1. The fingerprint 1 in the similar fingerprints of the data block corresponds to data blocks C0, C1, C2, C3, C4, C5, and C6. The fingerprint 2 corresponds to data blocks C0, D1, C3, D3, C5, and C7. The fingerprint 3 corresponds to data blocks C0, C3, C5, C7, D5, and D6. Because the similar fingerprints of the target data block include the fingerprint 1, the fingerprint 2, and the fingerprint 3, a data block group formed by the data blocks corresponding to the fingerprint 1 is a data block group corresponding to the target data block, a data block group formed by the data blocks corresponding to the fingerprint 2 is a data block group corresponding to the target data block, and a data block group formed by the data blocks corresponding to the fingerprint 3 is a data block group corresponding to the target data block. For the fingerprint 1, C0 is selected as a reference block. If both C3 and C0 have a same strongly similar fingerprint (namely, the target fingerprint), C3 may be left in a data block group in which C0 is used as a reference block, and the data block group in which C0 is used as a reference block is a combined data block group to which the target data block C3 belongs. For the fingerprint 1, the target fingerprint also exists in C5 and C6. In this case, C5 and C6 may be added to the data block group in which C0 is used as a reference block. For the fingerprint 2, the target fingerprint also exists in C7, and C7 may be added to the data block group in which C0 is used as a reference block. Because the target fingerprint exists in all selected data blocks, the target fingerprint exists in all data blocks in the combined data block group.

Manner 2: Determine, based on a similar fingerprint quantity, a data block group corresponding to the target data block, where the similar fingerprint quantity is a quantity of same similar fingerprints in any two data blocks in one data block group; determine a quantity of same similar fingerprints in the target data block and in a data block in each data block group; and form, in the data block group corresponding to the target data block, a first quantity of data blocks that have a maximum quantity of same similar fingerprints as the target data block into the combined data block group to which the target data block belongs.

During implementation, the foregoing similar fingerprint table is established in the storage system, and an uncompressed data block corresponding to each fingerprint in the similar fingerprint of the target data block may be determined from the similar fingerprint table. Then, data blocks having a similar fingerprint quantity of same fingerprints are grouped into one group by using the similar fingerprint quantity, to determine a data block group where the target data block is located, namely the data block group corresponding to the target data block.

When the target data block has not been selected as a member of another reference block, data blocks that are in the data block group corresponding to the target data block and that do not form a combined data block group with another data block are determined, a quantity of same similar fingerprints in the data blocks and in the target data block is determined, and then data blocks are arranged in descending order. The first quantity of the data blocks are selected to form the combined data block group to which the target data block belongs.

For the target data block, when a member is selected for the other reference block, the first quantity of members need to be selected for a reference block. In a ranking (in descending order) of quantities of same similar fingerprints in the reference block and in uncompressed data blocks that are in a data block group corresponding to the reference block, if the target data block belongs to the first quantity, a combined data block group to which the reference block belongs may be determined as the combined data block group to which the target data block belongs.

For example, similar fingerprints of a target data block E3 include a fingerprint 1, a fingerprint 2, and a fingerprint 3, and the similar fingerprint quantity is 1. The fingerprint 1 in the similar fingerprints of the data block corresponds to data blocks E0, E1, E2, E3, E4, E5, and E6. The fingerprint 2 corresponds to data blocks E0, F1, E3, F3, E5, and E7. The fingerprint 3 corresponds to data blocks E0, E3, E5, E7, F5, and F6. Because the similar fingerprints of the target data block include the fingerprint 1, the fingerprint 2, and the fingerprint 3, a data block group formed by the data blocks corresponding to the fingerprint 1 is a data block group corresponding to the target data block, a data block group formed by the data blocks corresponding to the fingerprint 2 is a data block group corresponding to the target data block, and a data block group formed by the data blocks corresponding to the fingerprint 3 is a data block group corresponding to the target data block. Currently, uncompressed data blocks include E2, E4, E5, E6, F5, and F6. Quantities of same similar fingerprints are arranged in a descending order as E4, E5, F5, F6, E2, and E6. The first quantity is 6. E4, E5, F5, F6, E2, and E3 may be selected to form a combined data block group.

It should be noted that, if a quantity of data blocks in a data block group is limited, after the quantity of data blocks in the combined data block group reaches the first quantity, no data block is further added to the combined data block group.

In addition, after a second quantity of batch processing cycles (for example, the second quantity may be 2), if no similar data block or repeated data block is found for some data blocks, the data blocks may be directly compressed and stored in a conventional manner. Alternatively, after the second quantity of batch processing processes, if no similar data block or repeated data block is found for some data blocks, the data blocks may be directly compressed and stored in a conventional manner.

In addition, in this embodiment of this application, the data block group corresponding to the target data block may alternatively be determined not based on the similar fingerprint quantity. A first data block of processed data blocks in the batch is used as the reference block. The first quantity of data blocks having same strongly similar fingerprints are selected from the remaining data blocks, to form a data block group to which the first data block belongs. Alternatively, the first quantity of data blocks having a maximum quantity of same similar fingerprints as the first data block are selected from the remaining data blocks, to form a data block group to which the first data block belongs. Next, a first data block is selected from data blocks that do not form a data block group as the reference block, and then processing of selecting data blocks from the remaining data blocks continues to be performed, to obtain a data block group to which the first data block belongs. In this manner, the combined data block group to which the target data block belongs may be obtained. In addition, if the first quantity of data blocks having the same strongly similar fingerprints cannot be selected for the first data block, a data block whose similar fingerprint quantity exceeds a value may be selected after the current selection, and added to the data block group using the first data block as the reference block.

For the foregoing combined data block group, manners of determining the reference block are further provided in this embodiment of this application.

Manner 1: In the combined data block group, a first added data block is determined as the reference block.

During implementation, in the combined data block group, an adding order of each data block may be determined, and an earliest added data block is determined as the reference block of the combined data block group. For example, in the foregoing example, C0 is first added, and C0 is determined as the reference block.

Manner 2: In the combined data block group, a data block that has a highest data reduction rate of the combined data block group is determined as the reference block.

During implementation, when the data blocks in the combined data block group are compressed, any data block is used as the reference block, and each data block in the combined data block group is compressed to obtain compressed data of each data block in the combined data block group. Then, a data amount of the combined data block group before compression is compared with a data amount of the compressed data of the combined data block group, to obtain a reduction rate corresponding to the reference block. For any reference block, this manner may be used to determine a reduction rate corresponding to the reference block. A data block with a largest reduction rate is selected as the reference block.

For example, the combined data block group includes three data blocks: A1, A2, and A3. When A1 is used as the reference block, an overall reduction rate of the combined data block group is 77%. When A2 is used as the reference block, the overall reduction rate of the combined data block group is 65%. When A3 is used as the reference block, the overall reduction rate of the combined data block group is 50%. In this way, it may be obtained that the overall reduction rate of the combined data block group is the highest when A1 is used as the reference block. Therefore, in the combined data block group, A1 may be used as the reference block.

It should be noted that determining efficiency of the foregoing manner 1 of determining the reference block is relatively high, but a data block with a highest reduction rate may not be selected. In the foregoing manner 2 of determining the reference block, although a compressed block with a high reduction rate can be determined, a selection process is complex and efficiency is relatively low. Therefore, when there are a relatively large quantity of data blocks in the combined data block group, the manner 1 of determining the reference block may be selected, to improve selection efficiency. However, when there are a relatively small quantity of data blocks in the combined data block group, the manner 2 of determining the reference block may be selected, to provide a high reduction rate.

Step 304: Perform similar compression on the target data block based on the reference block in the combined data block group.

During implementation, the storage system may determine differential data between the target data block and the reference block in the combined data block group. If the reference block has been compressed, the differential data may be directly compressed to obtain compressed data of the target data block. If the reference block has not been compressed, the reference block may be compressed, and the differential data is compressed. Subsequently, data of the target data block may be restored by using data of the reference block and the differential data.

In an optional implementation, in the storage system, data in a same combined data block group may be stored in a storage block, and may be stored in a same storage block, or may be stored in different storage blocks. This is not limited in this embodiment of this application. When the data is stored in different storage blocks, if the reference block and differential data of a currently to-be-read data block are in a same storage block, the reference block and the differential data may be directly read from the storage block at a time (if the reference block is in the front, the reading may be performed from the reference block to the differential data of the to-be-read data block; and if the reference block is in the back, the reading may be performed from the differential data of the to-be-read data block to the reference block). If the reference block and the differential data of the currently to-be-read data block are not in a same storage block, the reference block and the differential data may be separately read from different storage blocks.

In an optional implementation, in the storage system, compressed data is stored in a storage block. During storage, compressed data of a same combined data block group needs to be stored in one storage block and is consecutively stored. The processing may be as follows:

consecutively storing, in a same storage block, compressed data obtained after similar compression is performed on data blocks, and compressed data of another data block in the combined data block group.

During implementation, when compressed data obtained after similar compression is performed on the target data block is stored, a storage block in which the compressed data of the other data block in the combined data block group is stored and a storage location of the compressed data in the storage block may be determined. Then, the compressed data obtained after similar compression is performed on the target data block and the compressed data of the other data block in the combined data block group are consecutively stored together.

Figure 4:
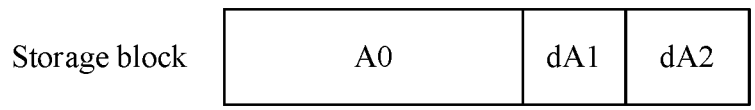
FIG. 4 is a schematic diagram of storage of a data block according to an example embodiment of this application.

For example, as shown in FIG. 4, the data blocks are A1 and A2, A0 is a reference block, dA1 is differential data between A1 and A0, and dA2 is differential data between A2 and A0. A0, dA1, and dA2 may be stored in a same storage block, and are consecutively stored, where A0 is adjacent to dA1, and dA1 is adjacent to dA2.

It should be noted that, because a processing resource is consumed each time data is read, the reference block and the differential data are generally read at a time instead of being read twice, to save the processing resource. Therefore, the compressed data in the foregoing combined data block group is consecutively stored in one storage block, so that the reference block, and the differential data between the other data block and the reference block may be read at a time during reading.

In an optional implementation, to reduce an amount of data read at a time, a location in which the data of the reference block is stored may be configured, and the processing may be as follows:

if there are a plurality of data blocks other than the reference block in the combined data block group, compressed data of m data blocks is before the data of the reference block, and compressed data of n data blocks is after the reference block, where a difference between m and n is equal to any one of 0, 1, or −1, and both m and n are greater than or equal to 1.

During implementation, if there are a plurality of data blocks other than the reference block in the combined data block group, assuming that there are m+n data blocks other than the reference block, the compressed data of m data blocks may be set before the data of the reference block, and the compressed data of n data blocks may be set after the data of the reference block. If m+n is an odd number, a relationship between m and n may be that m−n is equal to 1 or −1. If m+n is an even number, a relationship between m and n may be that m−n is equal to 0. In this way, during data reading, if differential data of a data block after the reference block needs to be read, the reading may directly start from the reference block until the differential data of the data block is read, without a need to read differential data of all data blocks. If differential data of a data block before the reference block needs to be read, the reading may directly start from the differential data of the data block, and ends after the data of the reference block is read, without a need to read all the data. Therefore, less data is read, and reading efficiency is improved.

Figure 5:
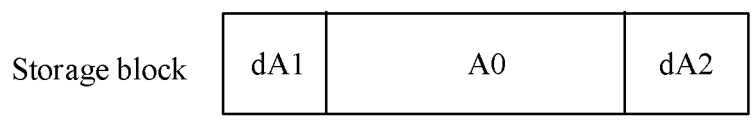
FIG. 5 is a schematic diagram of storage of a data block according to an example embodiment of this application.

For example, as shown in FIG. 5 that corresponds to FIG. 4, in addition to the reference block, there are two data blocks A1 and A2 in the combined data block group, and A0 is stored between dA1 and dA2. In this way, when data of A2 is read, the reading may directly start from A0, and ends after dA2 is read, without a need to read dA1. This can speed up the reading. When data of A1 is read, the reading may start from dA1, and ends after A0 is read, without a need to read dA2. This can speed up the reading.

In addition, when there is one data block other than the reference block in the combined data block group, the data of the reference block may be located before compressed data of another data block in the combined data block group, or may be located after the compressed data of the other data block in the combined data block group.

In addition, the length of the storage block is generally fixed. When the storage block is not fully stored after data of one combined data block group is stored in the storage block, the storage block may store data of another combined data block group, but data of a same combined data block group needs to be stored in a same storage block, to facilitate subsequent reading.

Figure 6:
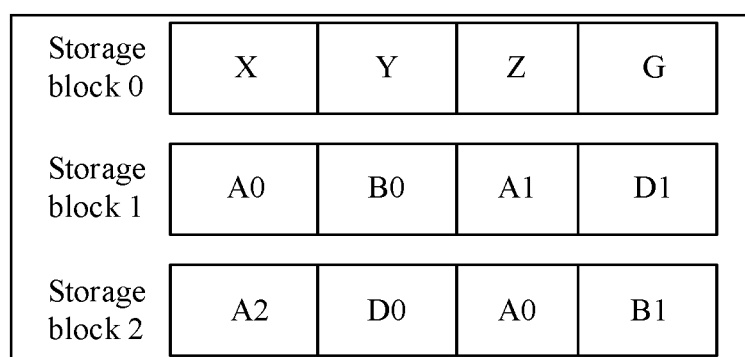
FIG. 6 is a schematic diagram of storage of a storage block according to an example embodiment of this application.
Figure 6:
Figure 6:
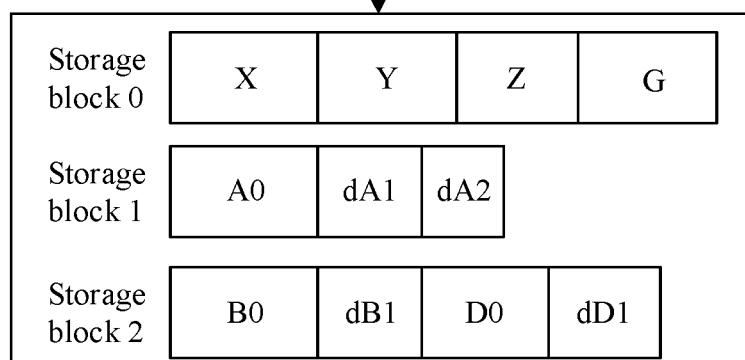

To describe a structure of the storage block more clearly, an embodiment of this application further provides a structure of a storage block. As shown in FIG. 6, in original structures of storage blocks, a storage block 0 is used to store data blocks X, Y, Z, and G, a storage block 1 is used to store data blocks A0, B0, A1, and D1, and a storage block 2 is used to store data blocks A2, D0, A0, and B1. The data blocks X, Y, Z, and G are data blocks on which deduplication or similar compression is not performed, and no change may be made. Because both the storage block 1 and the storage block 2 have A0, deduplication may be performed, to delete one A0. Because both A1 and A2 are similar to A0, similar compression may be performed, to obtain differential data dA1 between A1 and A0 and differential data dA2 between A2 and A0. dA1, dA2, and A0 may be placed in one storage block and stored in the storage block 1. Because B0 is similar to B1 and B0 is a reference block, similar compression may be performed, to obtain differential data dB1 between B1 and B0. Because D1 is similar to D0 and D0 is a reference block, similar compression may be performed, to obtain differential data dD1 between D1 and D0. B0 and dB1 may be stored in a same storage block, D0 and dD1 may be stored in a same storage block, and B0, dB1, D0 and dD1 are stored in the storage block 2. In other words, the storage blocks are classified into two types. One type of storage block is used to store a data block on which deduplication and/or similar compression are not performed, and the other type of storage block is used to store a data block on which deduplication and/or similar compression are performed.

In addition, in the foregoing step 304, compressed data of a same combined data block group may be stored in a same compressed block, and the processing may be as follows:

if a compressed block to which the combined data block group belongs has a remaining capacity, compress differential data between a data block and a reference block, and store the compressed data in the compressed block; or if a compressed block to which the combined data block group belongs has no remaining capacity, create a new compressed block, re-determine a data block group to which a data block belongs, select a reference block from the re-determined data block group, compress differential data of the data block and the re-selected reference block, and store the compressed data into the newly created compressed block.

Each compressed block is used to store compressed data of one combined data block group, and a data amount of data that can be stored in the compressed block is a fixed value which may be 16 KB, 32 KB, or another value.

During implementation, when similar compression is performed on a target data block in a combined data block group, a compressed block to which the combined data block group belongs has a remaining capacity, and the remaining capacity is greater than or equal to a data amount of differential data between the target data block and the reference block in the combined data block group, the differential data between the target data block and the reference block in the combined data block group may be compressed, and then the compressed differential data is stored in the compressed block.

If the compressed block to which the combined data block group belongs has no remaining capacity to store the differential data of the target data block relative to the reference block, a new compressed block may be created. If there is another data block that is in the combined data block group and that is not compressed, the target data block and the other data block in the combined data block group may form a new combined data block group, and then a reference block is determined in the new combined data block group. A data block that is first added may be determined as the reference block, or a data block that maximizes a reduction rate of the new combined data block group may be determined as the reference block (in this case, the target data block may also be selected as the reference block). If the target data block is not the reference block, differential data between the target data block and the reselected reference block is compressed, the compressed data is stored in the new compressed block, and the reference block in the new combined data block group may be stored. If the target data block is the reference block, conventional compression and storage may be directly performed, and similar compression may be performed on another data block with reference to the target data block. In this way, the target data block can be compressed.

Figure 7:
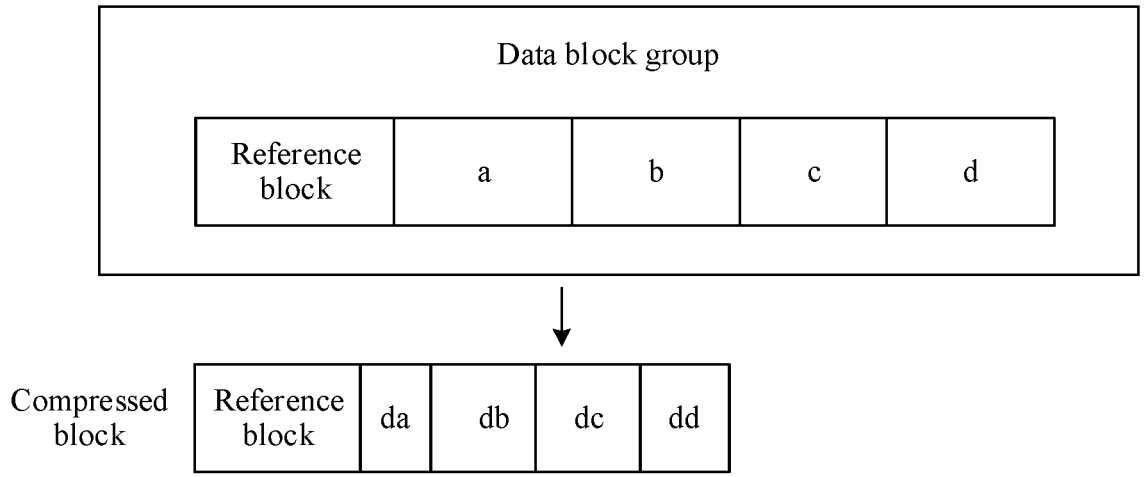
FIG. 7 is a schematic diagram of a compressed block according to an example embodiment of this application.

For example, as shown in FIG. 7, a combined data block group to which data blocks belong includes five data blocks: a reference block, a, b, c, and d. The first data block is the reference block. Lossless compression is performed on data of the reference block, similar compression is performed on the other data blocks relative to the reference block, and compressed data blocks are stored in one data block. The compressed blocks of the other data blocks are sequentially da, db, dc, and dd.

It should be noted that the compressed block generally can store a small amount of data to facilitate reading. If the compressed block can store a large amount of data, when the data is read, reading needs to be performed from the reference block to the end, to read the data at the end of the compressed block, and therefore a large amount of data is read at a time, and more resources are wasted.

According to the embodiments of this application, a new storage system may directly combine deduplication and similar compression, to obtain a system with a new compression technology. For a system that is online, if there are no deduplication and similar compression, an independent processing mechanism may be embedded into the system.

In this embodiment of this application, when a data block is stored, whether deduplication can be performed on a target data block is determined; when deduplication cannot be performed on the target data block, a similar fingerprint of the target data block is obtained; a combined data block group to which the target data block belongs is determined based on the similar fingerprint; and similar compression is performed on the target data block based on a reference block in the combined data block group. In this way, similar compression and deduplication are combined. When deduplication cannot be performed, similar compression can be used to further compress some data, to improve a reduction rate.

Figure 8:
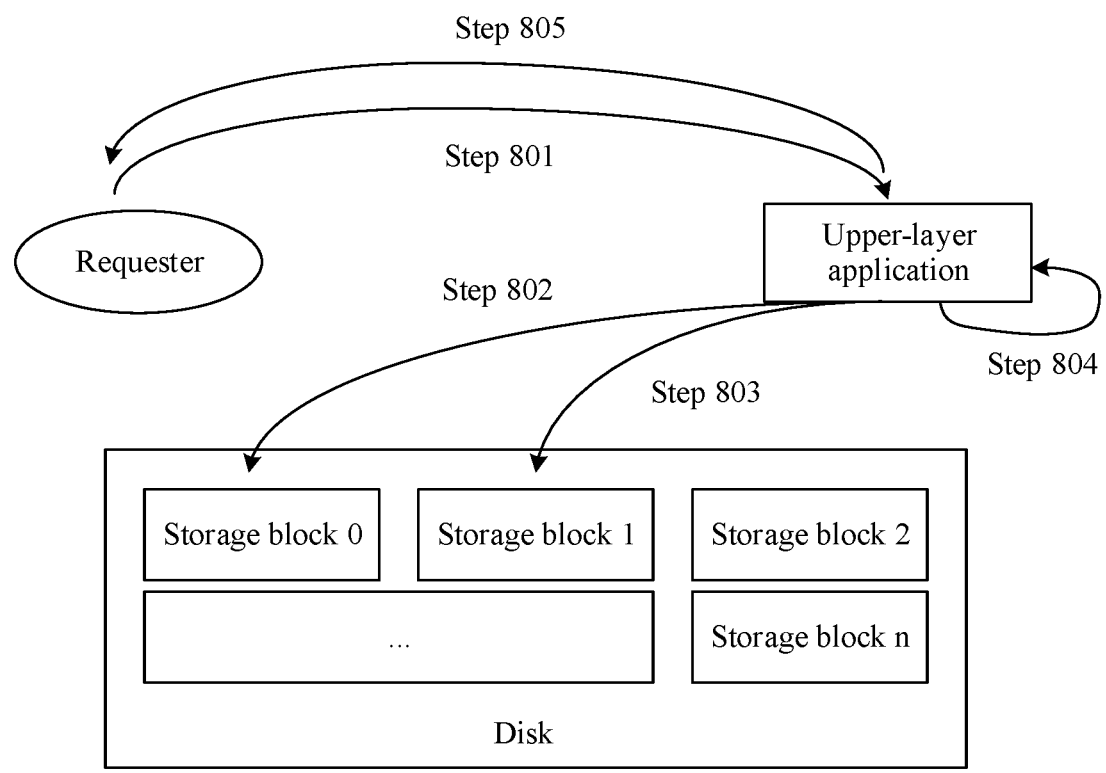
FIG. 8 is a flowchart of a method for reading data according to an example embodiment of this application.

Based on the foregoing processing of compressing data, an embodiment of this application further correspondingly provides a process of reading compressed data. That compressed data in a combined data block group is stored in a same storage block is used as an example. Reading steps are shown in FIG. 8.

Step 801: Receive a read request for a to-be-read data block.

During implementation, after a data block is stored in a storage system, if the data block needs to be read subsequently, a read request may be sent to the storage system, and an identifier of the to-be-read data block is carried in the read request.

Step 802: Obtain metadata information of the to-be-read data block.

During implementation, the storage system may read the metadata information of the to-be-read data block from a storage block (the metadata information is usually stored in a first storage block) by using the identifier of the to-be-read data block, and the metadata information may include a storage block in which a reference block of the to-be-read data block is located, a location of the reference block in the storage block, and an offset location of the to-be-read data block relative to the reference block (the offset location may be an offset data amount, a quantity of offset data blocks, or the like). For example, eight data blocks are shifted rightwards from the location of the reference block.

Step 803: Read, based on the metadata information, the reference block of the to-be-read data block and differential data between the to-be-read data block and the reference block from the storage block to which the reference block of the to-be-read data block belongs.

During implementation, after obtaining the metadata information, the storage system may determine, by using the metadata information, the location of the reference block in the storage block and the offset location of the to-be-read data block relative to the reference block. If the reference block is before the differential data of the to-be-read data block, reading may start from the reference block until the differential data between the to-be-read data block and the reference block is read. If the reference block is after the differential data of the to-be-read data block, reading may start from the to-be-read data block until the reference block is read. Data of the reference block and the differential data between the to-be-read data block and the reference block are obtained from read data.

It should be noted herein that the storage block in which the reference block is located further includes a header (head) of the reference block, and the header is used to describe a quantity of data blocks included in the storage block, a data amount of the storage block, and the like.

Step 804: Restore data of the to-be-read data block based on the reference block and the differential data.

During implementation, the storage system may superpose the data of the reference block with the differential data, to obtain all data of the to-be-read data block.

Step 805: Send the data of the to-be-read data block to a requester.

In this way, in one process of reading data from a disk, if the metadata information is stored in a memory, because in the storage block, reading may start from the reference block until the differential data of the to-be-read data block is read. When differential data of another data block exists between the reference block and the differential data of the to-be-read data block, the differential data of the other data block is also read. In this case, although the differential data of the other data block is read, compared with first reading the data of the reference block and then reading the differential data of the to-be-read data block, this way occupies less processing resources. It can be learned that in this application, all the data of the to-be-read data block can be read only once.

If the metadata information is stored in the disk, the metadata information of the to-be-read data block is read from the disk, and then the differential data between the reference block and the to-be-read data block is read from the storage block at a time. Therefore, in this application, all the data of the to-be-read data block can be read only twice.

Figure 9:
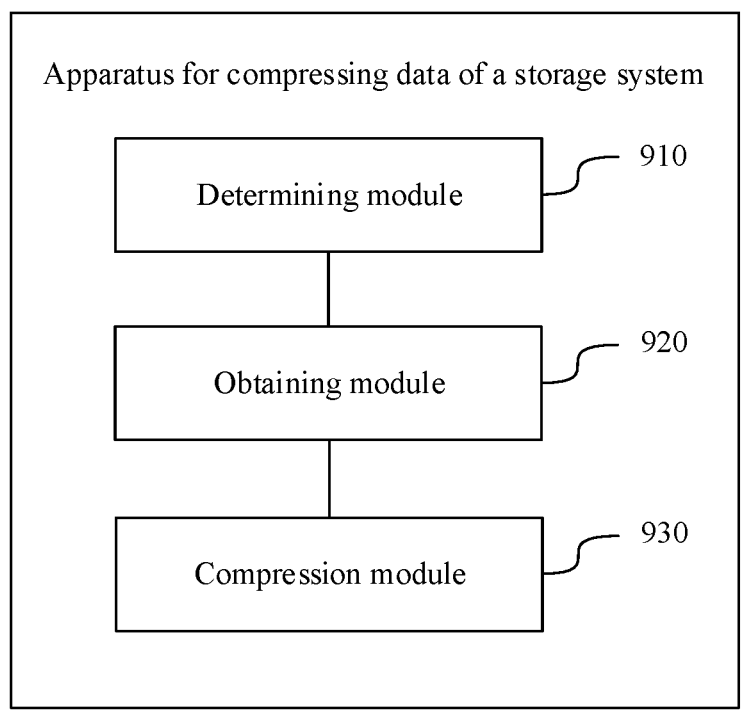
FIG. 9 is a schematic diagram of a structure of an apparatus for compressing data of a storage system according to an example embodiment of this application.

FIG. 9 is a structural diagram of an apparatus for compressing data of a storage system according to an embodiment of this application. The apparatus may be implemented as a part of the apparatus or the entire apparatus by using software, hardware, or a combination thereof. The apparatus provided in this embodiment of this application may implement the procedure in the embodiment of this application shown in FIG. 3. The apparatus includes a determining module 910, an obtaining module 920, and a compression module 930.

The determining module 910 is configured to determine whether deduplication can be performed on a target data block, and may specifically be configured to perform the step 301 and implicit steps included therein.

The obtaining module 920 is configured to, when deduplication cannot be performed on the target data block, obtain a similar fingerprint of the target data block, and may specifically be configured to perform the step 302 and implicit steps included therein.

The determining module 910 is further configured to determine, based on the similar fingerprint, a combined data block group to which the target data block belongs, and may specifically be configured to perform the step 303 and the implicit steps included therein.

The compression module 930 is configured to perform similar compression on the data block based on a reference block in the combined data block group, and may specifically be configured to perform the step 304 and implicit steps included therein.

In an optional implementation, the determining module 910 is configured to:
generate a deduplication fingerprint of the target data block; and
query whether the storage system has a fingerprint that is the same as the deduplication fingerprint, to determine whether deduplication can be performed on the target data block.

In an optional implementation, the determining module 910 is configured to:
determine a load of the storage system to determine whether deduplication can be performed on the target data block.

In an optional implementation, the compression module 930 is further configured to:
consecutively store, in a same storage block, compressed data obtained after similar compression is performed on the target data block, and compressed data of another data block in the combined data block group.

In an optional implementation, if there are a plurality of data blocks other than the reference block in the combined data block group, compressed data of m data blocks is before data of the reference block, and compressed data of n data blocks is after the reference block, where a difference between m and n is equal to any one of 0, 1, or −1, and both m and n are greater than or equal to 1.

In an optional implementation, the determining module 910 is further configured to:
determine, based on a similar fingerprint quantity, a data block group corresponding to the target data block, where the similar fingerprint quantity is a quantity of same similar fingerprints in any two data blocks in one data block group; and form, in the data block group corresponding to the target data block, a first quantity of data blocks that have a same target fingerprint as the target data block into the combined data block group to which the target data block belongs, where a data amount of differential data between the target data block and a data block that has the target fingerprint is less than a data amount of differential data between the target data block and a data block that does not have the target fingerprint.

In an optional implementation, the determining module 910 is further configured to:

determine, based on a similar fingerprint quantity, a data block group corresponding to the target data block, where the similar fingerprint quantity is a quantity of same similar fingerprints in any two data blocks in one data block group; determine a quantity of same similar fingerprints in the target data block and in a data block in each data block group; and form, in the data block group corresponding to the target data block, a first quantity of data blocks that have a maximum quantity of same similar fingerprints as the target data block into the combined data block group to which the target data block belongs.

In this embodiment of this application, when a data block is stored, whether deduplication can be performed on a target data block is determined; when deduplication cannot be performed on the target data block, a similar fingerprint of the target data block is obtained; a combined data block group to which the target data block belongs is determined based on the similar fingerprint; and similar compression is performed on the target data block based on a reference block in the combined data block group. In this way, similar compression and deduplication are combined. When deduplication cannot be performed, similar compression can be used to further compress some data, to improve a reduction rate.

It should be noted that when the apparatus for compressing data of a storage system, provided in the foregoing embodiment, processes data, division of the foregoing functional modules is used only as an example for description. In actual application, the foregoing functions may be allocated to different functional modules and implemented according to a requirement, in other words, an internal structure of the apparatus is divided into different functional modules for implementing all or some of the functions described above. In addition, the apparatus for compressing data of a storage system, provided in the foregoing embodiment, and the embodiment of the method for compressing data of a storage system belong to a same concept. For details about a specific implementation process of the apparatus, refer to the method embodiment. Details are not described herein again.

In an optional implementation, an embodiment of this application further provides a computer-readable storage medium. The computer-readable storage medium stores an instruction, and when the computer-readable storage medium runs on a storage system, the storage system is enabled to perform the foregoing method for compressing data of a storage system.

In an optional implementation, an embodiment of this application further provides a computer program product including an instruction. When the computer program product runs on a storage system, the storage system is enabled to perform the foregoing method for compressing data of a storage system.

All or some of the foregoing embodiments may be implemented by using software, hardware, firmware, or any combination thereof. When the software is used for implementation, all or some of the embodiments may be implemented in a form of a computer program product. The computer program product includes one or more computer instructions. When the computer program instructions are loaded and executed on a server or a terminal, all or some of the procedures or functions according to the embodiments of the present invention are generated. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial optical cable, an optical fiber, or a digital subscriber line) or wireless (for example, infrared, radio, or microwave) manner. The computer-readable storage medium may be any usable medium accessible by a server or a terminal, or a data storage device, such as a server or a data center, integrating one or more usable media. The usable medium may be a magnetic medium (for example, a floppy disk, a hard disk, and a magnetic tape), an optical medium (for example, a digital video disk (Digital Video Disk, DVD)), or a semiconductor medium (for example, a solid-state drive).

The foregoing descriptions are merely example embodiments of this application, but are not intended to limit this application. Any modification, equivalent replacement, or improvement made without departing from the spirit and principle of this application should fall within the protection scope of this application.

What is claimed is:

1. A method for compressing data of a storage system, comprising:
   determining whether deduplication can be performed on a target data block;
   when deduplication cannot be performed on the target data block, obtaining a similar fingerprint of the target data block;
   determining, based on the similar fingerprint, a combined data block group to which the target data block belongs; and
   performing similar compression on the target data block based on a reference block in the combined data block group,
   wherein the step of determining the combined data block group to which the target data block belongs comprises:
   determining, based on a similar fingerprint quantity, a data block group corresponding to the target data block, wherein the similar fingerprint quantity is a quantity of same similar fingerprints in any two data blocks in one data block group; and
   forming, in the data block group corresponding to the target data block, a first quantity of data blocks that have a same target fingerprint as the target data block into the combined data block group to which the target data block belongs, wherein a data amount of differential data between the target data block and a data block that has the target fingerprint is less than a data amount of differential data between the target data block and a data block that does not have the target fingerprint.

2. The method according to claim 1, wherein the step of determining whether deduplication can be performed on a target data block comprises:
   generating a deduplication fingerprint of the target data block; and
   querying whether the storage system has a fingerprint that is the same as the deduplication fingerprint, to determine whether deduplication can be performed on the target data block.

3. The method according to claim 1, wherein the step of determining whether deduplication can be performed on a target data block comprises:
   determining a load of the storage system to determine whether deduplication can be performed on the target data block.

4. The method according to claim 1, further comprising:
   consecutively storing, in a same storage block, compressed data obtained after similar compression is performed on the target data block, and compressed data of another data block in the combined data block group.

5. The method according to claim 4, wherein when there is a plurality of data blocks other than the reference block in the combined data block group, compressed data of m data blocks is before data of the reference block, and compressed data of n data blocks is after the data of the reference block, wherein a difference between m and n is equal to any one of 0, 1, or −1, and both m and n are greater than or equal to 1.

6. A storage system with compressed data, comprising:
   an interface;
   a memory storing executable instructions; and
   a processor configured to execute the executable instructions to:
   determine whether deduplication can be performed on a target data block;
   when deduplication cannot be performed on the target data block, obtain a similar fingerprint of the target data block;
   determine, based on the similar fingerprint, a combined data block group to which the target data block belongs; and
   perform similar compression on the target data block based on a reference block in the combined data block group,
   wherein the processor is configured to determine the combined data block group by:
   determining, based on a similar fingerprint quantity, a data block group corresponding to the target data block, wherein the similar fingerprint quantity is a quantity of same similar fingerprints in any two data blocks in one data block group; and
   forming, in the data block group corresponding to the target data block, a first quantity of data blocks that have a same target fingerprint as the target data block into the combined data block group to which the target data block belongs, wherein a data amount of differential data between the target data block and a data block that has the target fingerprint is less than a data amount of differential data between the target data block and a data block that does not have the target fingerprint.

7. The storage system according to claim 6, wherein the processor is configured to determine whether deduplication can be performed on the target data block by:
   generating a deduplication fingerprint of the target data block; and
   querying whether the storage system has a fingerprint that is the same as the deduplication fingerprint, to determine whether deduplication can be performed on the target data block.

8. The storage system according to claim 6, wherein the processor is configured to determine whether deduplication can be performed on the target data block by:
   determining a load of the storage system to determine whether deduplication can be performed on the target data block.

9. The storage system according to claim 6, wherein the storage system further comprises a storage memory, and the processor is further configured to:
   consecutively store, in a same storage block of the storage memory, compressed data obtained after similar compression is performed on the target data block, and compressed data of another data block in the combined data block group.

10. The storage system according to claim 9, wherein when there is a plurality of data blocks other than the reference block in the combined data block group, compressed data of m data blocks is before data of the reference block, and compressed data of n data blocks is after the reference block, wherein a difference between m and n is equal to any one of 0, 1, or −1, and both m and n are greater than or equal to 1.

11. A non-transitory computer-readable storage medium having stored thereon executable instructions that, when executed by a processor of a storage system, cause the storage system to perform operations of:
  determining whether deduplication can be performed on a target data block;
  when deduplication cannot be performed on the target data block, obtaining a similar fingerprint of the target data block;
  determining, based on the similar fingerprint, a combined data block group to which the target data block belongs; and
  performing similar compression on the target data block based on a reference block in the combined data block group,
  wherein the operation of determining the combined data block group to which the target data block belongs comprises:
    determining, based on a similar fingerprint quantity, a data block group corresponding to the target data block, wherein the similar fingerprint quantity is a quantity of same similar fingerprints in any two data blocks in one data block group; and
    forming, in the data block group corresponding to the target data block, a first quantity of data blocks that have a same target fingerprint as the target data block into the combined data block group to which the target data block belongs, wherein a data amount of differential data between the target data block and a data block that has the target fingerprint is less than a data amount of differential data between the target data block and a data block that does not have the target fingerprint.

* * * * *